(12) United States Patent
Asada (10) Patent No.: US 12,321,094 B2
(45) Date of Patent: Jun. 3, 2025

(54) DISPLAY CONTROL METHOD, EDITING SUPPORT METHOD AND INFORMATION PROCESSING APPARATUS

(71) Applicant: CANON KABUSHIKI KAISHA, Tokyo (JP)

(72) Inventor: Kunihiko Asada, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 443 days.

(21) Appl. No.: 17/151,969

(22) Filed: Jan. 19, 2021

(65) Prior Publication Data
US 2021/0232044 A1 Jul. 29, 2021

(30) Foreign Application Priority Data
Jan. 23, 2020 (JP) .................................. 2020-009446

(51) Int. Cl.
G03F 7/00 (2006.01)
G06F 3/0482 (2013.01)

(52) U.S. Cl.
CPC .......... *G03F 7/0002* (2013.01); *G06F 3/0482* (2013.01)

(58) Field of Classification Search
CPC ... G03F 7/0002; G03F 7/70483; G06F 3/0482
See application file for complete search history.

(56) References Cited

U.S. PATENT DOCUMENTS

| | | | | |
|---|---|---|---|---|
| 2010/0098859 A1* | 4/2010 | Schumaker | ............ | B82Y 40/00 264/293 |
| 2015/0234287 A1* | 8/2015 | Tanaka | .................. | G03F 7/7035 355/27 |
| 2015/0352756 A1* | 12/2015 | Yamaguchi | ........... | G03F 7/0002 425/141 |
| 2016/0231648 A1* | 8/2016 | Hirano | .................. | B29C 64/386 |
| 2017/0212419 A1* | 7/2017 | Aihara | .................... | B82Y 40/00 |
| 2018/0329315 A1* | 11/2018 | Hirano | .................. | G03F 7/0002 |
| 2018/0370091 A1* | 12/2018 | Aihara | .................. | H01L 21/027 |

FOREIGN PATENT DOCUMENTS

| | | | |
|---|---|---|---|
| JP | 2011161832 A | | 8/2011 |
| JP | 2012004354 A | | 1/2012 |
| JP | 2013004537 A | | 1/2013 |
| JP | 2015153953 A | | 8/2015 |
| JP | 2017045774 A | | 3/2017 |
| JP | 2017117958 A | * | 6/2017 |
| JP | 2018073989 A | | 5/2018 |
| JP | 2019009420 A | | 1/2019 |
| KR | 1020110137731 A | | 12/2011 |
| KR | 1020150141893 A | | 12/2015 |
| KR | 1020190001521 A | | 1/2019 |

OTHER PUBLICATIONS

English translation of JP-2017117958-A by EPO. (Year: 2017).*
English translation of JP 2011161832 A by EPO. (Year: 2011).*

* cited by examiner

*Primary Examiner* — John J DeRusso
*Assistant Examiner* — Inja Song
(74) *Attorney, Agent, or Firm* — ROSSI, KIMMS & McDOWELL LLP (57) ABSTRACT

A display control method includes determining whether control information for controlling an arrangement of an imprint material with respect to a shot region of a substrate conforms to a rule, and displaying, on a display, the determination result together with shot region information indicating the shot region.

12 Claims, 11 Drawing Sheets

```
#DropPattern
#No: (Xpos(mm), Ypos(mm)), Volume(uL)
1: (-12.64, -16.20), 6.0E-6
2: (-12.43, -16.20), 6.0E-6
3: (-12.22, -16.20), 6.0E-6
4: (-12.01, -16.20), 6.0E-6
5: (-11.80, -16.20), 6.0E-6
6: (-11.59, -16.20), 6.0E-6
7: (-11.37, -16.20), 6.0E-6
8: (-11.16, -16.20), 6.0E-6
9: (-10.95, -16.20), 6.0E-6
10: (-10.74, -16.20), 6.0E-6
11: (-10.53, -16.20), 6.0E-6
        ×
        ×
        ×
        ×
        ×
```

DISPLAY CONTROL METHOD, EDITING SUPPORT METHOD AND INFORMATION PROCESSING APPARATUS

BACKGROUND OF THE INVENTION

Field of the Invention

The present invention relates to an imprint technique and, more specifically, to a display control method, an editing support method, an article manufacturing method, a non-transitory computer readable medium, and an information processing apparatus.

Description of the Related Art

There is an imprint apparatus that arranges an imprint material on a shot region of a substrate, brings a mold into contact with the imprint material, cures the imprint material, and separates the mold from the imprint material, thereby forming a pattern of the imprint material on the shot region. Forming a pattern of an imprint material on a shot region by such a method is called imprinting. The imprint material can be arranged in a drop state on the shot region. The arrangement of the drops of the imprint material with respect to the shot region can be controlled based on a drop pattern. The drop pattern can include information such as the position of arranging the drop of the imprint material, the volume of the drop, and the like. The drop pattern can be created in consideration of the pattern of the mold, the position of the shot region on the substrate, the control method of the operation of bringing the mold into contact with the imprint material, the imprint order of a plurality of shot regions, and the like.

If the supply amount of the imprint material onto the shot region is insufficient, a defect can be generated due to poor filling of the imprint material to the space between the substrate and the mold. If the supply amount of the imprint material onto the shot region is excessive, the imprint material can protrude from the shot region. If the imprint material protruding from the shot region is cured, a particle can be generated by the protruding imprint material. If such a particle is sandwiched between the substrate and the mold, a defect may be generated in the formed pattern, or the substrate and/or the mold can be damaged.

Japanese Patent Laid-Open No. 2018-73989 describes an imprint method of forming a pattern of an imprint material on a substrate including a step in a periphery region. In this imprint method, based on the position of the step, a process is controlled in which the imprint material is arranged on the substrate so as not to arrange the imprint material in a region on the outer periphery side of the position of the step.

A plurality of shot regions of a substrate can include a rectangular shot region called a full field and a non-rectangular shot region called a partial field. The full field is a shot region whose outer shape is not restricted by the edge of the substrate. The partial field is a shot region whose outer shape is restricted by the edge of the substrate, and a part of the partial field can have a shape along the edge of the substrate. One shot region can include a plurality of chip regions partitioned by scribe lines and, normally, the number of the chip regions included in the partial field is smaller than the number of the chip regions included in the full field.

The partial fields can have various shapes depending on the positions thereof on the substrate. Therefore, the drop pattern for each of the plurality of partial fields included in the substrate needs to be optimized for the individual partial field. Further, the drop pattern for each of the plurality of full fields included in the substrate may be optimized in accordance with the imprint order, the direction of airflow on the substrate, or the like.

After the drop patterns for the respective shot regions are generated, the drop patterns can be assigned to the corresponding shot regions by a user on an operation terminal. The number of shot regions of the substrate is, for example, about a hundred, and the operation of correctly assigning the drop patterns to such a large number of shot regions is very difficult for the user. If the drop patterns are incorrectly assigned, problems can occur such as generation of a defect, damaging the substrate and/or the mold, and the like.

SUMMARY OF THE INVENTION

The present invention provides a technique advantageous in correctly setting control information for controlling the arrangement of an imprint material with respect to a shot region of a substrate.

One of aspects of the present invention provides a display control method comprising: determining whether control information for controlling an arrangement of an imprint material with respect to a shot region of a substrate conforms to a rule; and displaying, on a display, a determination result in the determining together with shot region information indicating the shot region.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1:
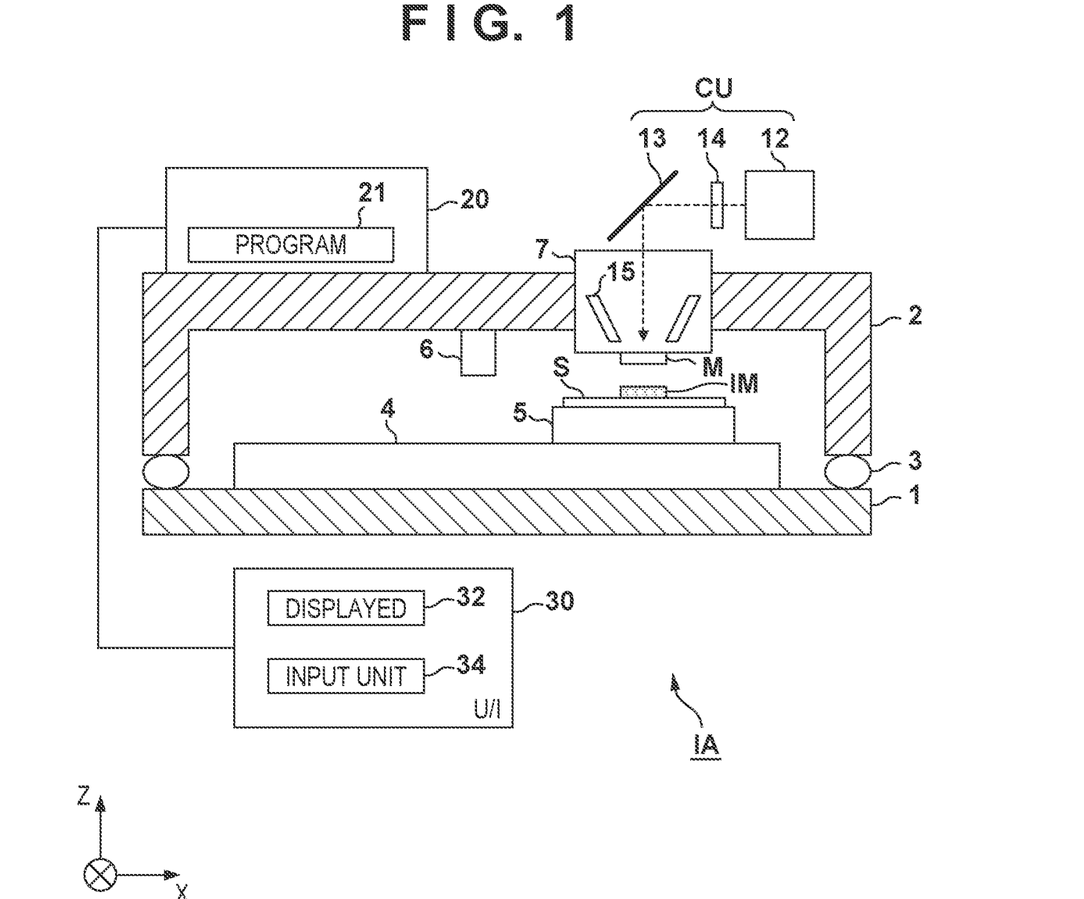
FIG. 1 is a view showing the arrangement of an imprint apparatus according to one embodiment of the present invention.

FIG. 1 schematically shows the arrangement of an imprint apparatus IA according to one embodiment of the present invention. The imprint apparatus IA performs an imprint process in which an imprint material IM is arranged on a shot region of's substrate S, a mold M is brought into contact with the imprint material IM, the imprint material IM is cured, and then the mold M is separated from the imprint material IM. By the imprint process, a pattern of the imprint material IM is formed on the substrate S. The substrate S includes a plurality of shot regions, and the plurality of shot regions can include a rectangular shot region called a full field and a non-rectangular shot region called a partial field. The full field is a shot region whose outer shape is not restricted by the edge of the substrate. The partial field is a shot region whose outer shape is restricted by the edge of the substrate (the outer periphery of the substrate), and a part of the partial field can have a shape along the edge of the substrate. The substrate S may include a pattern, or may not include a pattern. In the latter case, the shot region can be a shot region on design.

As the imprint material, a curable composition (to be also referred to a resin in an uncured state) to be cured by receiving curing energy is used. As the curing energy, an electromagnetic wave or heat is used. The electromagnetic wave is light selected from the wavelength range of 10 nm (inclusive) to 1 mm (inclusive), for example, infrared light, a visible light beam, ultraviolet light, or the like.

The curable composition is a composition cured by light irradiation or heating. A photo-curable composition cured by light contains at least a polymerizable compound and a photopolymerization initiator, and may contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (the viscosity at 25° C.) of the imprint material is, for example, 1 mPa's (inclusive) to 100 mPa's (inclusive).

As a substrate, glass, ceramic, a metal, a semiconductor, a resin, or the like is used. A member made of a material different from that of the substrate may be formed on the surface of the substrate, as needed. More specifically, the substrate is a silicon wafer, a semiconductor compound wafer, silica glass, or the like.

In the specification and the accompanying drawings, directions will be indicated on an XYZ coordinate system in which directions parallel to the surface of the substrate S are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are OX, BY, and AZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z axes, and a posture is information that can be specified by values on the θX-, θY-, and θZ-axes. Positioning means controlling the position and/or posture. Alignment (positioning) can include controlling the position and/or posture of at least one of the substrate S and the mold M such that the alignment error (overlay error) between the shot region of the substrate S and the pattern region of the mold M decreases. In addition, alignment can include control to correct or change the shape of at least one of the shot region of the substrate S and the pattern region of the mold M.

The imprint apparatus IA can include a substrate holding unit 5, a substrate driving mechanism 4, a mold driving mechanism 7, an alignment scope 15, a curing unit CU, a dispenser 6, a base plate 1, a damper 3, a frame 2, a controller 20, and a user interface 30 . . . . The substrate holding unit 5 holds the substrate S. The substrate driving mechanism 4 drives the substrate S by driving the substrate holding unit 5. The substrate driving mechanism 4 can be configured to drive the substrate S in a plurality of axes (for example, three axes of the X-axis, the Y-axis, and the θZ-axis, and preferably six axes of the X-axis, the Y-axis, the Z-axis, the θX-axis, the θY-axis, and the θZ-axis). The position and posture of the substrate holding unit 5 are measured using a measuring instrument (not shown), and the substrate driving mechanism 4 can drive the substrate holding unit 5 (substrate S) based on the measurement result. The mold driving mechanism 7 holds the mold M and drives the mold M. The mold driving mechanism 7 can be configured to drive the mold M in a plurality of axes (for example, three axes of the Z-axis, the θX-axis, and the θY-axis, and preferably six axes of the X-axis, the Y-axis, the Z-axis, the θX-axis, the θY-axis, and the θZ-axis).

The alignment scope 15 can be used to detect the relative position between a mark provided for the shot region of the substrate S and a mark of the mold M. Typically, the relative position between the mark of the shot region and the mark of the mold M is detected for each of a plurality of mark pairs, and the substrate driving mechanism 4 and/or the mold driving mechanism 7 can align the shot region and the mold M based on the detection results. The mark pair is formed by the mark of the shot region and the mark of the mold M. Although not shown, the imprint apparatus LA may include a substrate deformation mechanism that deforms the substrate (shot region) and/or a mold deformation mechanism that deforms the mold M.

The curing unit CU cures the imprint material IM by irradiating the imprint material IM with curing energy (for example, light such as ultraviolet light) in a state in which the imprint material IM on the shot region of the substrate S is in contact with the mold M. The curing unit CU can include, for example, a light source 12, a shutter 14, and an optical unit (for example, mirror) 13. The curing energy emitted from the light source 12 can be applied to the imprint material IM via the shutter 14, the optical unit 13, the mold driving mechanism 7, and the mold M. The shutter 14 can be used to block the curing energy emitted from the light source 12.

The dispenser 6 (supply unit) can arrange, based on a drop pattern, a drop (droplet) of the imprint material IM on the substrate S or the shot region of the substrate S. The controller 20 can control, based on the drop pattern, discharge of the drop of the imprint material IM from the dispenser 6 and driving of the substrate S by the substrate driving mechanism 4. With this operation, the drop of the imprint material IM can be arranged at a position on the surface of the substrate S defined by the drop pattern. The drop pattern (to be also referred to as a drop recipe) is control information for controlling the arrangement of the imprint material with respect to the shot region of the substrate S.

The base plate 1 can support the substrate driving mechanism 4. The base plate 1 can also support the frame 2 via the damper 3. The frame 2 can support the mold driving mechanism 7 and the dispenser 6. The controller 20 can control the substrate holding unit 5, the substrate driving mechanism 4, the mold driving mechanism 7, the alignment scope 15, the curing unit CU, the dispenser 6, and the user interface 30. The user interface 30 can include, for example, a display 32 and an input unit 34. The software (driver or the like) for controlling the user interface 30 can be installed in the controller 20. The controller 20 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer installed with a program, or a combination of all or some of these components. The controller 20 includes, for example, a computer readable memory storing a program (control program) 21, and can be operated based on the program 21. The controller 20 may be understood as an information processing apparatus or a computer.

A plurality of drop patterns respectively corresponding to the plurality of shot regions of the substrate S can be loaded to the controller 20 from a memory medium or via a communication path such a network. The user interface 30 enables the user operating the user interface 30 to assign the plurality of drop patterns loaded in the controller 20 to the corresponding shot regions. Further, the user interface 30 enables the user operating the user interface 30 to edit the drop pattern to be assigned to the shot region or the drop pattern having been assigned to the shot region. The controller 20 may be connected to the imprint apparatus IA via a communication path such as a network. Some functions (for example, a function of assigning the drop pattern to the shot region and a related function) of the controller 20 and the user interface 30 may be provided by a terminal apparatus connected the imprint apparatus IA via a communication path such as a network.

A plurality of drop patterns (information related to the arrangement of the droplets of the imprint material) prepared in advance can be loaded (imported) to the controller 20 of the imprint apparatus IA. By operating the input unit 34 of the user interface 30, the user can assign each drop pattern to the shot region corresponding to the drop pattern among the plurality of shot regions of the substrate S. This assigning operation can include assigning each drop pattern to the corresponding shot region by, for example, drag and drop, in a state in which a shot layout showing the layout of the plurality of shot regions on the substrate S is displayed on the display 32. The number of the shot regions of the substrate S is, for example, about a hundred, and the operation of correctly assigning the drop patterns to such a large number of shot regions is very difficult for the user. Further, the drop patterns loaded in the controller 20 of the imprint apparatus IA can be incorrect:

After the assignment of the drop patterns to all the shot regions is completed, an imprint process is performed by arranging the imprint material in accordance with the assignment, and at least one drop pattern can be changed based on the result of the imprint process. The changed drop pattern can be incorrect. Alternatively, the changed drop pattern may be assigned to an unintended shot region.

Figure 2:
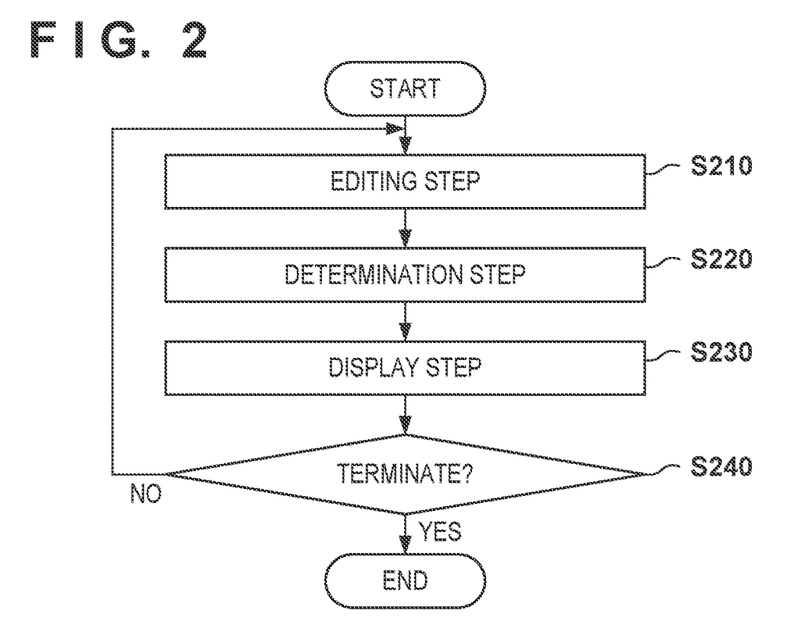
FIG. 2 is a flowchart showing the first example of the operation of a controller.

FIG. 2 shows the first example of the operation of the controller 20. This operation can be understood as a display control method of controlling display of the display 32, or an editing support method of supporting editing of the drop pattern (control information) for controlling the arrangement of the imprint material with respect to the shot region of the substrate S. The display control method according to the first example can include determination step S220 and display step S230. The display control method according to the first example may further include termination determination step S240. The editing support method according to the first example can include editing step S210, determination step S220, and display step S230. The display control method according to the first example may further include termination determination step S240.

The controller 20 may be understood as an information processing apparatus or a computer that includes a determiner corresponding to determination step S220 and a display controller corresponding to display step S230. The controller 20 may be understood as an information processing apparatus or a computer that includes a determiner corresponding to determination step S220, a display controller corresponding to display step S230, and a termination determiner corresponding to termination determination step S240. The controller 20 may be understood as an information processing apparatus or a computer that includes an editor corresponding to editing step S210, a determiner corresponding to determination step S220, a display controller corresponding to display step S230, and a termination determiner corresponding to termination determination step S240.

Editing step S210 can be a step of editing the drop pattern (control information) in accordance with the operation of the input unit 34 of the user interface 30 by the user. Determination step S220 can be a step of determining whether the drop pattern edited in editing step S210 conforms to the rule. Display step S230 can be a step of displaying, on the display 32, the determination result in determination step S220 together with shot region information the shot region. Termination determination step S240 can be a step of determining whether to terminate steps S210 to S230. If it is not determined to terminate steps S210 to S230 in termination determination step S240, steps S210 to S230 can be repeated. With this operation, one set of drop patterns (this can be understood as the control information) including the plurality of drop patterns respectively assigned to the plurality of shot regions is generated. In termination determination step S240, it is possible to determine to terminate steps S210 to S230 in accordance with the operation of the input unit 34 by the user.

Figure 3:
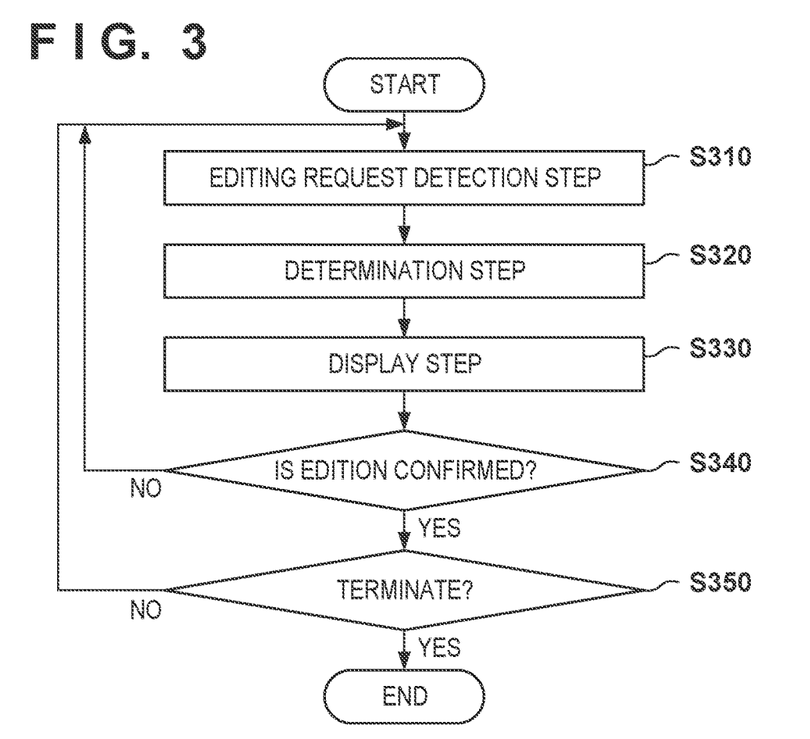
FIG. 3 is a flowchart showing the second example of the operation of the controller.

FIG. 3 shows the second example of the operation of the controller 20. This operation can be understood as an editing support method of supporting editing of the drop pattern for controlling the arrangement of the imprint material with respect to the shot region of the substrate S. The editing support method according to the second example can include editing request detection step S310, determination step S320, display step S330, and first determination step S340. The editing support method according to the second example may further include second determination step S350.

The controller 20 may be understood as an information processing apparatus or a computer that includes a detection unit corresponding to editing request detection step S310, a determiner corresponding to determination step S320, a display controller corresponding to display step S330, and a first determiner corresponding to first determination step S340. Such the information processing apparatus or the computer may further include a second determiner corresponding to second determination step S350.

Editing request detection step S310 can be a step of detecting a drop recipe editing request from the user provided via the operation of the input unit 34 of the user interface 30. The editing request can include, for example, a request for assigning the drop pattern to any one of the plurality of shot regions. The editing request can include, for example, a request for editing the drop patterns assigned to a plurality of shot regions. If the editing request from the user is detected, determination step S320 is executed. Determination step S320 can be a step of determining, when assuming that the drip recipe has been edited in accordance with the editing request detected in editing request detection step S310, whether the edited control information conforms to the rule. Display step S330 can be a step of displaying, on the display 32, the determination result in determination step S320 together with shot region information showing the shot region.

First determination step S340 can be a step of determining whether to confirm the editing of the control information in accordance with the editing request detected in editing request detection step S310. The editing of the control information in accordance with the editing request can be confirmed according to a command given from the user by operating the input unit 34. The user can determine, based on the display on the display 32 in display step S330, whether to confirm the editing request. The user can withdraw the editing request by operating the input unit 34. Editing request detection step S310 and first determination step S340 can be understood as an editing step.

Second determination step S350 can be a step of determining whether to terminate steps S310 to S340. In second determination step S350, it is possible to determine to terminate steps S310 to S340 in accordance with the operation of the input unit 34 of the user interface 30 by the user. If it is not determined to terminate steps S310 to S340 in second determination step S350, steps S310 to S340 can be repeated. With this operation, one set of drop patterns (this can be understood as the control information) including the plurality of drop patterns respectively assigned to the plurality of shot regions is generated.

Each of display steps S230 and S330 can include displaying, on the display 32, the drop arrangement information showing the arrangement of the imprint material with respect to the shot region together with the above-described determination result and the above-described shot region information. Here, each of display steps S230 and S330 can include displaying information corresponding to the volume of the drop of the imprint material. Further, each of display steps S230 and S330 can include enlarging and displaying, on the display 32, an image of a portion in which the drop pattern (control information) does not conform to the rule. Further, each of display steps S230 and S330 can include emphasizing and displaying that portion.

Each of display steps S230 and S330 can include displaying, on the display 32, the determination result for each of the plurality of shot regions of the substrate S in each of determination steps S220 and S320. Here, each of display steps S230 and S330 can include displaying, on the display 32, the shot layout information showing the arrangement of the plurality of shot regions together with the above-described determination result and the above-described shot region information.

Each of determination steps S220 and S320 can include determining, during editing the drop pattern (control information), whether the drop pattern conforms to the rule. Each of display steps S230 and S330 can include displaying, on the display 32, the determination result in each of determination steps S220 and S320 during editing the drop pattern.

Figure 4:
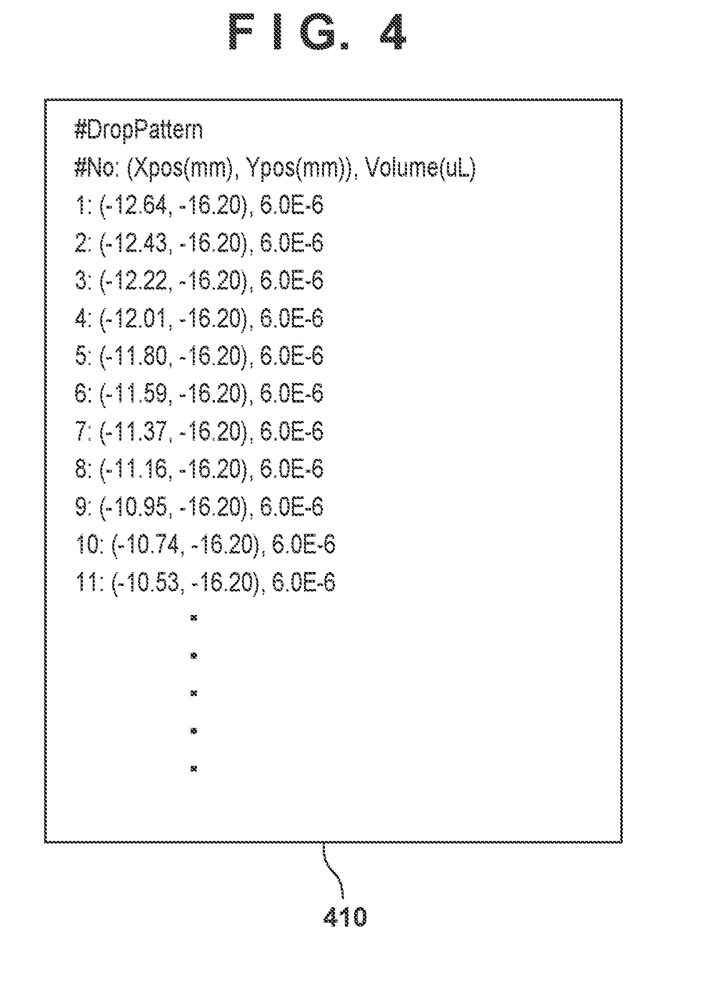
FIG. 4 is a view showing an example of a drop pattern.

FIG. 4 shows an example of a drop pattern 410. In the drop pattern 410, for example, with the center of the shot region as the center coordinates (0, 0), the position of the drop of the imprint material IM can be indicated by coordinate values. In the example shown in FIG. 4, "No" is the number (identifier) specifying the drop of the imprint material IM. (Xpos(mm), Ypos(mm)) indicates the coordinate values of the drop of the imprint material IM based on the center coordinates (0, 0) of the shot region. Volume (uL) indicates the volume of the drop of the imprint material IM, where "uL" means micro liter, and "E-6" means $10^{-6}$. The drop pattern 410 may include, for example, a shift amount (offset amount) by which all the drops of the imprint material described in the drop pattern 410 are shifted. The drop pattern 410 may include, for example, information for controlling the discharge timing of the drop of the imprint material IM from the dispenser 6. The drop pattern 410 may include, for example, information that specifies, among a plurality of discharge ports of the dispenser 6, the discharge port to discharge the drop of the imprint material IM. The drop pattern 410 may be formed by another information.

Figure 5:
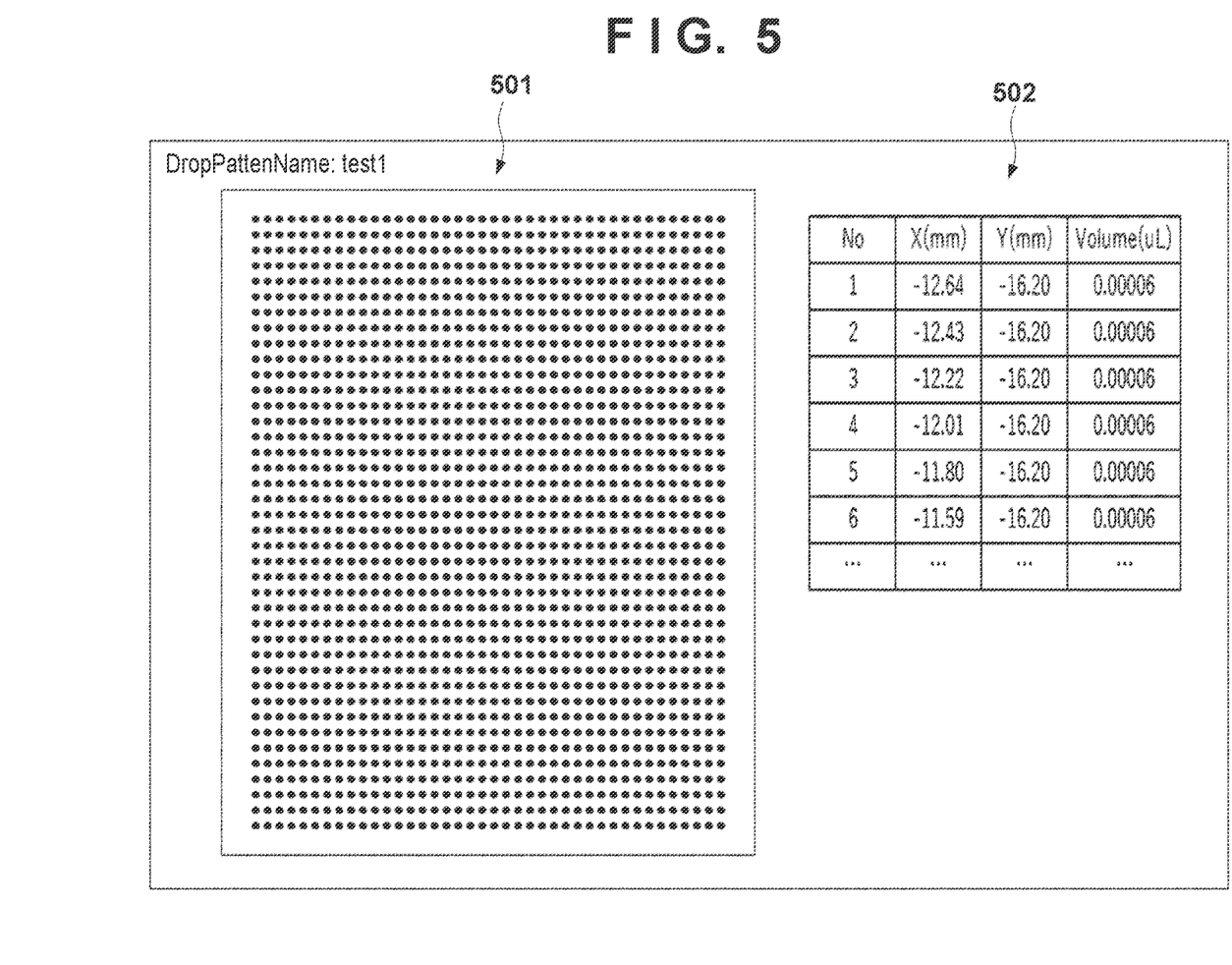
FIG. 5 is a view illustrating a drop pattern displayed on a display.

For example, in each of display steps S230 and S330, the controller 20 may visualize the drop pattern and display it on the display 32. FIG. 5 illustrates the drop pattern displayed on the display 32 (display screen thereof). The display of the drop pattern on the display screen of the display 32 can include a map format 501 and a table format 502. The map format 501 can include a figure (for example, a rectangle) showing the shot region and figures (for example, dots) each showing the position of the imprint material in the shot region. The table format 502 can include the coordinate values for indicating the position of the drop of the imprint material and the numeric expression indicating the volume of the drop of the imprint material.

The number of drops of the imprint material IM to be arranged in one shot region is not limited to a certain number, but can be several hundreds of thousands. Even if all of these drops are displayed on the display screen at the same time, it is difficult for human eyes to check them. Therefore, the controller 20 can have a zoom function of enlarging and displaying, on the display 32, the arrangement of the imprint material IM in the shot region. The enlargement can be performed by, for example, designating an enlargement target region. Alternatively, the enlargement can be performed while setting, as the center, a default position or a position designated by the user via the input unit 34. Further, in each of display steps S230 and S330, the controller 20 can enlarge and display, on the display 32, the arrangement of the drops of the imprint material IM in the shot region while setting, as the center, the position of an error indicated by the determination result in each of determination steps S220 and S320. The position of the error indicated by the determination result in each of determination steps S220 and S320 is the position where the drop pattern (control information) does not comfort to the rule.

Figure 6:
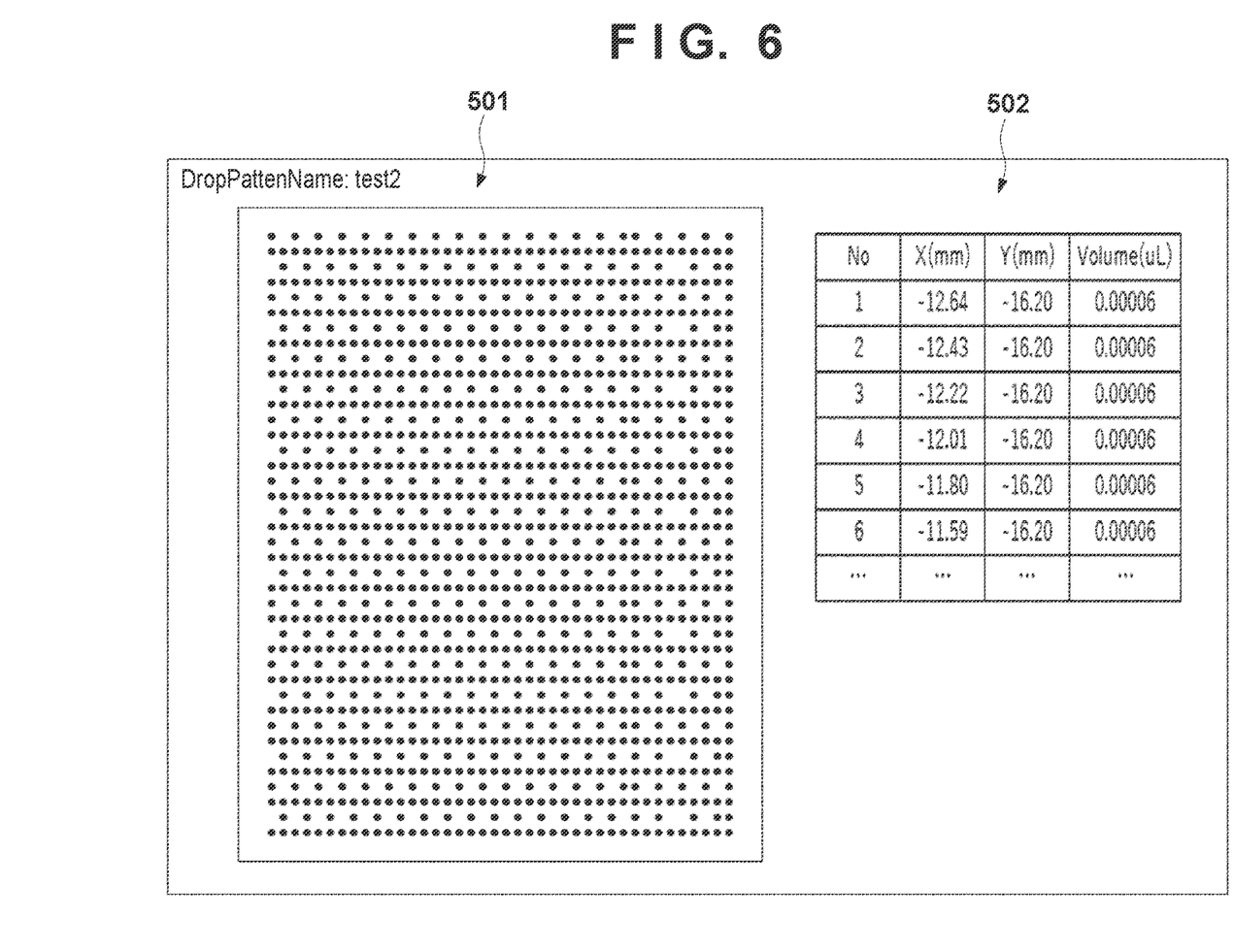
FIG. 6 is a view illustrating another drop pattern displayed on the display.
Figure 7:
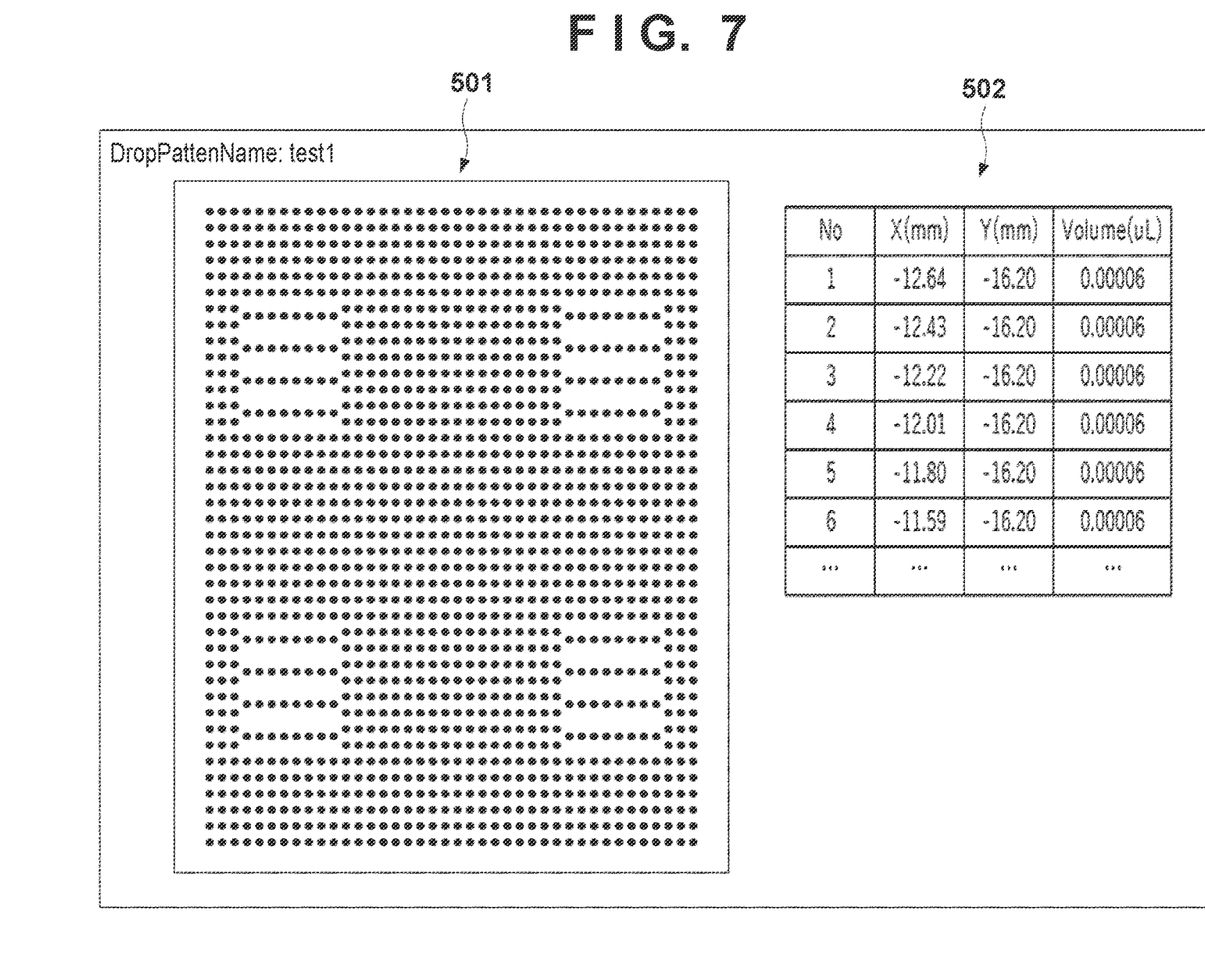
FIG. 7 is a view illustrating still another drop pattern displayed on the display.
Figure 8:
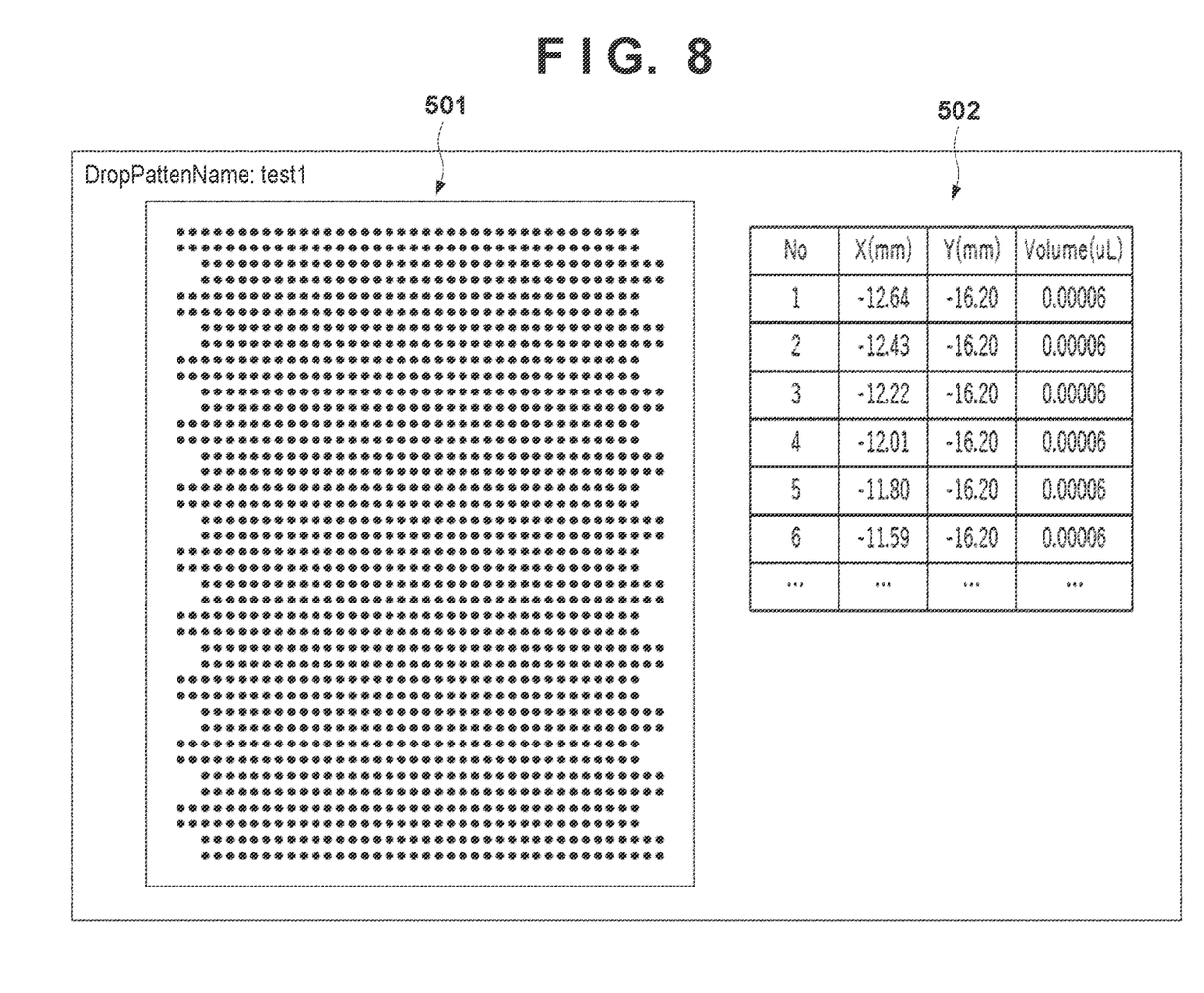
FIG. 8 is a view illustrating still another drop pattern displayed on the display.

The drop pattern can be determined based on the shape of the pattern included in the pattern region of the mold M, control of the imprint process, the evaluation result of the pattern formed by the imprint process, and the like, so that it can be complicated. In a simple drop pattern, drops of the imprint material are arranged in a grid pattern as illustrated in FIG. 5. However, if the pattern provided in the pattern region of the mold M has a density difference, as illustrated in FIG. 6 or 7, the density difference can be reflected on the drop pattern. Further, if the shape of the pattern region of the mold M is peculiar, as illustrated in FIG. 8, the shape of the pattern region can be reflected on the drop pattern.

The controller 20 may set the size of the figure (for example, dot) of the drop of the imprint material displayed on the display 32 (display screen thereof) to the size corresponding to the volume of the drop. In this case, the user can easily find an error in the volume set for the drop of the imprint material IM. Alternatively, the controller 20 may set the color of the figure (for example, dot) of the drop of the imprint material IM displayed on the display 32 (display screen thereof) to the color corresponding to the volume of the drop. This can enable the user to more easily find an error in the volume set for the drop of the imprint material IM.

In editing step S210 or the editing step (steps S310 and S340), the shot layout information showing the arrangement of the plurality of shot regions can be displayed on the display 32 (display screen thereof). The shot layout information can include the information showing the outer shape of the substrate S, the information showing the positional relationship among the plurality of shot regions, and the like. The user can perform editing for assigning the drop pattern to each shot region while viewing the shot layout information.

Figure 9A:
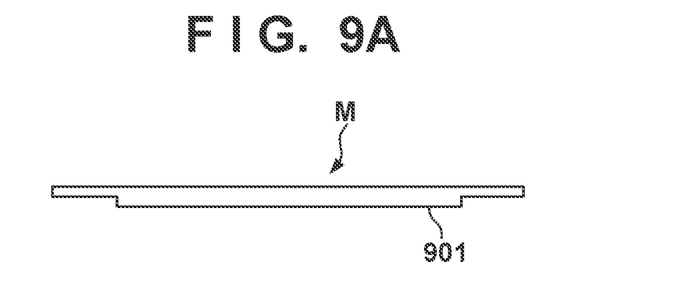
FIG. 9A is a view illustrating the arrangement of a mold.
Figure 9B:
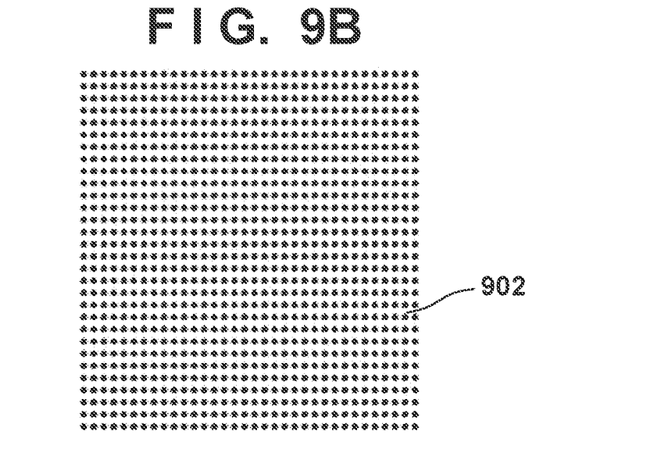
FIG. 9B is a view illustrating drop arrangement information.
Figure 9C:
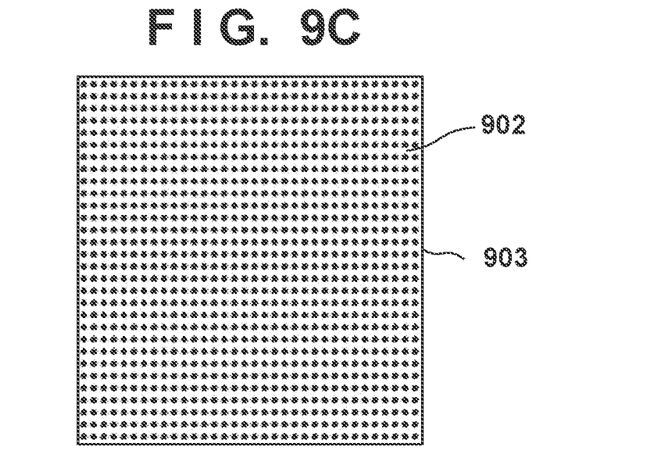
FIG. 9C is a view illustrating the drop arrangement information and shot region information displayed to overlap each other.

FIG. 9A schematically shows an arrangement example of the mold M. The mold M includes a pattern region 901. The pattern region 901 is provided with a pattern to be transferred to the substrate S (or the imprint material IM). FIG. 9B shows an example of drop arrangement information 902 showing the arrangement of the imprint material IM (drops thereof) with respect to the shot region. In the example shown in FIG. 9B, each drop of the imprint material IM is shown by a figure of a dot. The drop arrangement information 902 can be displayed on the display 32 (display screen thereof) in the format as shown in FIG. 9B under the control of the controller 20. FIG. 9C shows an example of shot region information 903 showing the shot region. The shot region information 903 can be displayed on the display 32 in the format as shown in FIG. 9C under the control of the controller 20. Further, as illustrated in FIG. 9C, the drop arrangement information 902 and the shot region information 903 can be displayed to overlap each other. Generally, the shape and size of the shot region shown by the shot region information 903 match the shape and size of the pattern region 901, respectively. Based on the display on the display 32 as illustrated in FIG. 9C, the user can check whether the drop pattern conforms to the rule.

Figure 10:
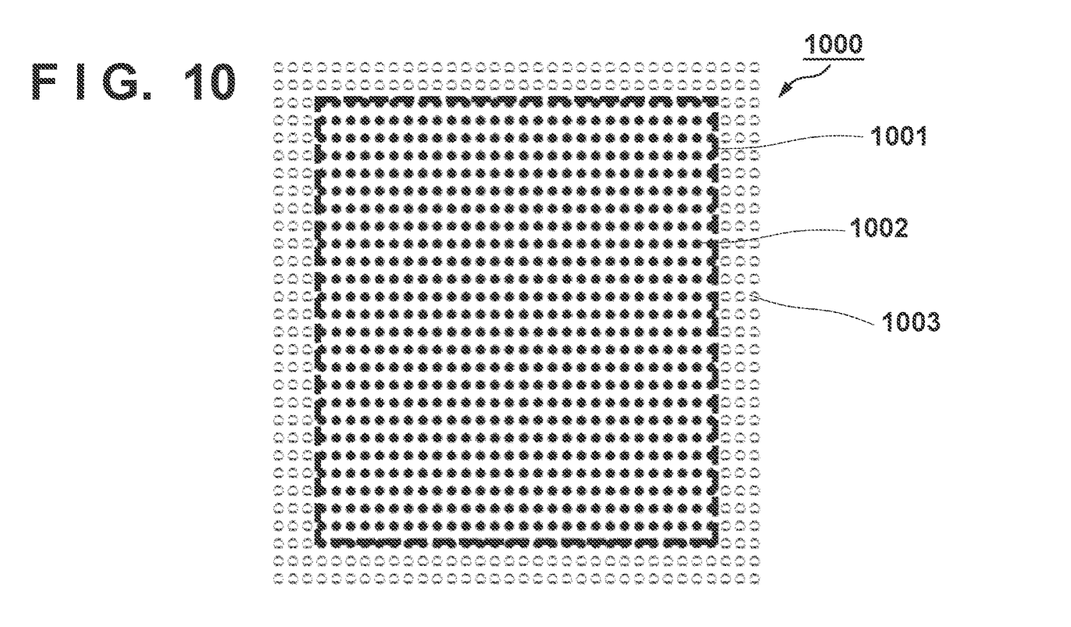
FIG. 10 is a view illustrating an image to be displayed on the display in a display step.

FIG. 10 illustrates an image 1000 to be displayed on the display 32 (display screen thereof) in each of display steps S230 and S330. The image 1000 can include shot region information 1001, drop arrangement information 1002, and drop arrangement information 1003. Here, the drop arrangement information 1002 shows the drops which have been determined to conform to the rule in each of determination steps S220 and S320, and the drop arrangement information 1003 shows the drops which have been determined not to conform to the rule in each of determination steps S220 and S320. The rule can be, for example, a rule that the drop must be arranged at a position inside the boundary line of the shot region and spaced apart from the boundary line by a predetermined distance or more. The predetermined distance may be a default distance, or may be a distance arbitrarily set by the user.

The drop arrangement information 1002 and the drop arrangement information 1003 are displayed in different display formats. That is, the display states of the drop arrangement information 1002 and the drop arrangement information 1003 show the determination results in each of determination steps S220 and S320. In the example shown in FIG. 10, the drop arrangement information 1002 is shown by black dots, and the drop arrangement information 1003 is shown by white dots. Such a difference in display format between the drop arrangement information 1002 and the drop arrangement information 1003 is merely an example, and another method may be used to distinguish them. For example, the drop arrangement information 1003 showing the drops not conforming to the rule (the portion not conforming to the rule) may be emphasized and displayed by, for example, being highlighted and/or flickered.

Since the drop arranged on the substrate spreads, there can be a case in which a part of the region occupied by the drop conforms to the rule but the other part does not conform to the rule. As to such a drop, it is possible to determine, based on information indicating the relationship between the volume of the drop and the region occupied by the drop, the region conforming to the rule and the region not conforming to the rule.

Figure 11:
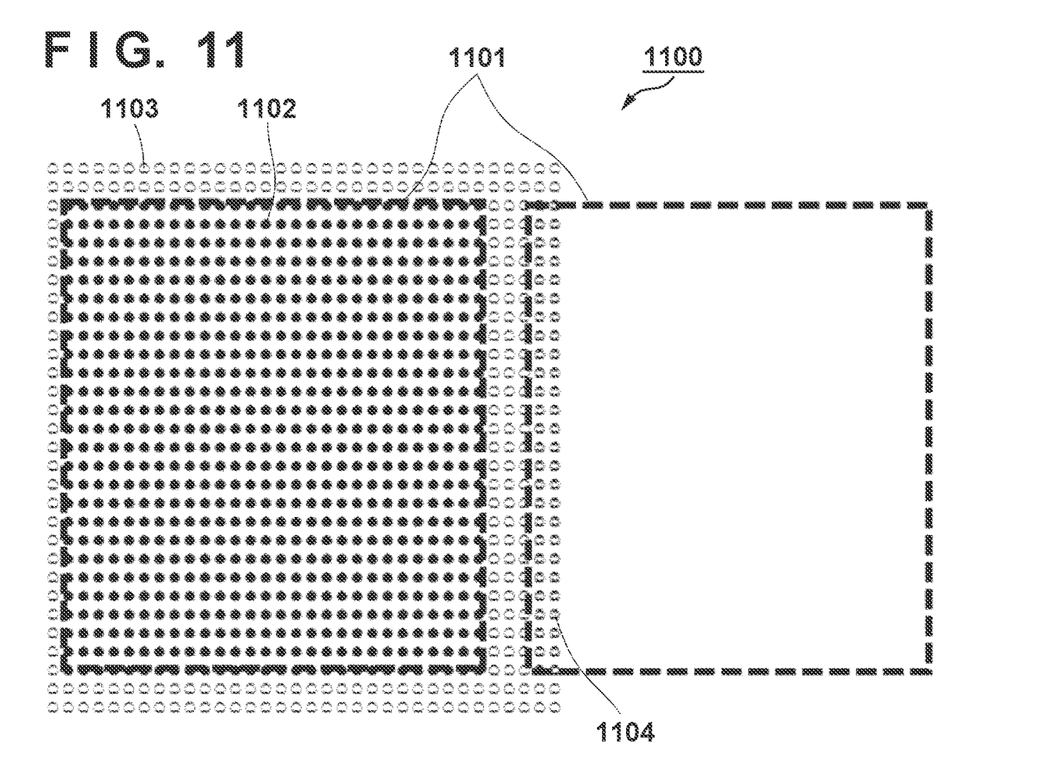
FIG. 11 is a view illustrating another image to be displayed on the display in the display step.

FIG. 1*l* illustrates an image 1100 to be displayed on the display 32 (display screen thereof) in each of display steps S230 and S330. The image 1100 can include shot region information 1101, drop arrangement information 1102, drop arrangement information 1103, and drop arrangement information 1104. The shot region information 1101 is the information showing each shot region, and also the information showing the arrangement of the plurality of shot regions. The drop arrangement information 1102 shows the drops which have been determined to conform to the rule in each of determination steps S220 and S320, and each of the drop arrangement information 1103 and the drop arrangement information 1104 shows the drops which have been determined not to conform to the rule in each of determination steps S220 and S320. The rule can include, for example, a rule that the drop must be arranged at a position inside the boundary line of the shot region and spaced apart from the boundary line by a predetermined distance or more, and a rule that the drop must not be arranged in another shot region. The predetermined distance may be a default distance, or may be a distance arbitrarily set by the user.

The drop arrangement information 1102, the drop arrangement information 1103, and the drop arrangement information 1104 are displayed in display formats different from each other. That is, the displays of the drop arrangement information 1102, the drop arrangement information 1103, and the drop arrangement information 1104 show the determination results in each of determination steps S220 and S320. In the example shown in FIG. 11, the drop arrangement information 1102 is shown by black dots, the drop arrangement information 1103 is shown by white dots with thin lines, and the drop arrangement information 1104 is shown by white dots with thick lines. Such distinction in display format among the drop arrangement information 1102, the drop arrangement information 1103, and the drop arrangement information 1104 is merely an example, and another method may be used to distinguish them.

Figure 12:
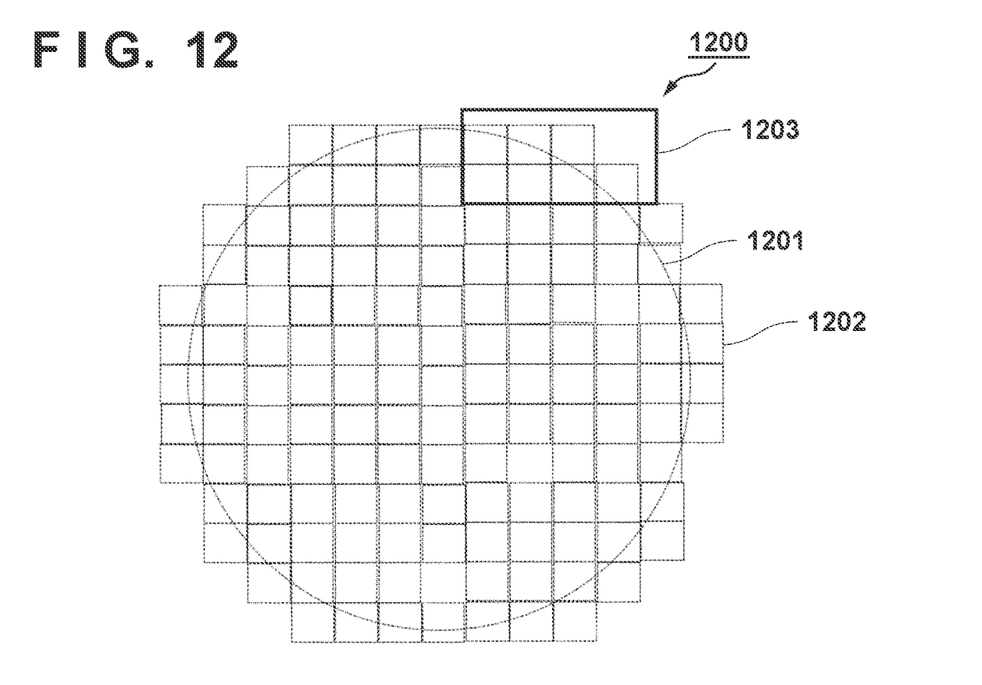
FIG. 12 is a view illustrating still another image to be displayed on the display in the display step.
Figure 13:
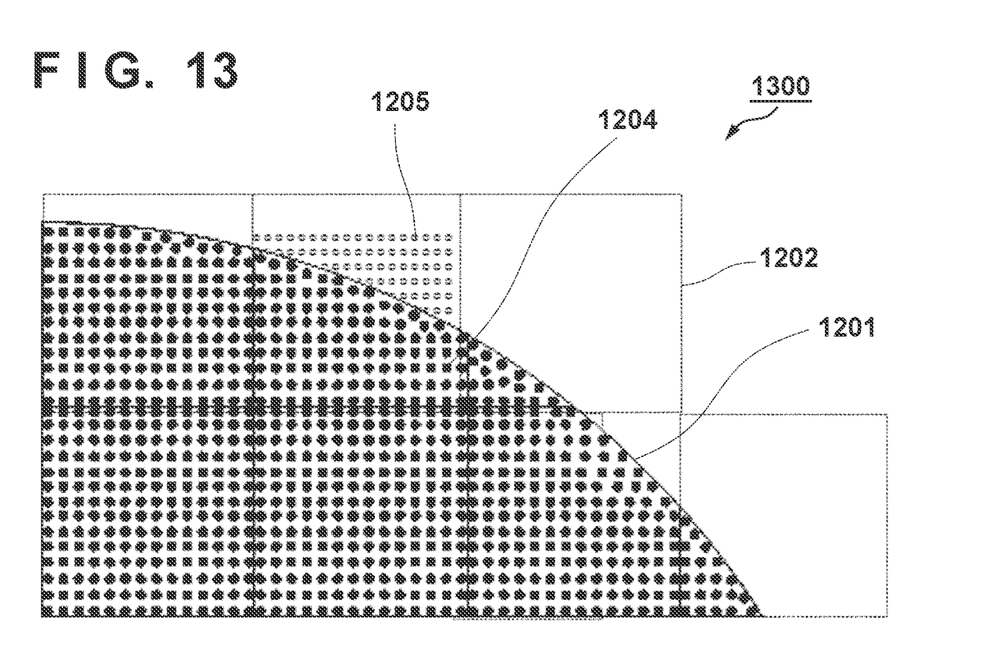
FIG. 13 is a view illustrating still another image to be displayed on the display in the display step.

FIGS. 12 and 13 illustrate images 1200 and 1300, respectively, to be displayed on the display 32 (display screen thereof) in each of display steps S230 and S330. In each of display steps S230 and S330, the image 1200 illustrated in FIG. 12 can be displayed first. The image 1200 can include substrate shape information 1201 showing the shape of the substrate S and shot layout information 1202. The substrate shape information 1201 may be understood as part of the shot layout information 1202. Each rectangle of the shot layout information 1202 indicates one shot region. A shot region in which the edge (outer shape or outer periphery) of the substrate S crosses the rectangle indicates a partial field, and a shot region in which the outer shape of the substrate S does not cross the rectangle indicates a full field. As to the partial field, only the region inside the outer shape of the substrate S undergoes the imprint process. The image 1200 can include region information 1203. The region information 1203 shows a region to be enlarged and displayed, and can be set by the user.

If enlarged display is instructed by the operation of the input unit 34 by the user, the image 1300 illustrated in FIG. 13 can be displayed. The image 1300 is an enlarged image of the region shown by the region information 1203 in FIG. 12. The image 1300 can include the substrate shape information 1201, the shot layout information (shot region information) 1202, drop arrangement information 1204, and drop arrangement information 1205. Here, the drop arrangement information 1204 shows the drops which have been determined to conform to the rule in each of determination steps S220 and S320, and the drop arrangement information 1205 shows the drops which have been determined not to conform to the rule in each of determination steps S220 and S320. The rule can be, for example, a rule that the drop must be arranged at a position inside the boundary line of the shot region and spaced apart from the boundary line by a predetermined distance or more. The predetermined distance may be a default distance, or may be a distance arbitrarily set by the user.

The drop arrangement information 1204 and the drop arrangement information 1205 are displayed in different display formats. That is, the display states of the drop arrangement information 1204 and the drop arrangement information 1205 show the determination results in each of determination steps S220 and S320. In the example shown in FIG. 13, the drop arrangement information 1204 is shown by black dots, and the drop arrangement information 1205 is shown by white dots. Such distinction in display format between the drop arrangement information 1204 and the drop arrangement information 1205 is merely an example, and another method may be used to distinguish them. For example, the drop arrangement information 1205 showing the drops not conforming to the rule (the portion not conforming to the rule) may be emphasized and displayed by, for example, being highlighted and/or flickered.

If the amount of data to be processed is large and the delay in processing is a problem, a mode may be provided in which only drops in the shot region and/or in the vicinity of the outer shape of the substrate are displayed on the display 32. If the drop pattern does not conform to the rule, the imprint process based on that drop pattern is prohibited, or a warning may be issued.

As has been described above, according to the embodiment described above, a technique is provided which is advantageous in correctly setting control information for controlling the arrangement of an imprint material with respect to a shot region of a substrate.

An article manufacturing method according to one embodiment of the present invention can include a step of forming a pattern on a substrate by operating an imprint apparatus based on a drop recipe edited using the above-described editing support method.

An article manufacturing method according to another embodiment of the present invention can include a step of arranging an imprint material on a substrate based on a drop recipe edited using the above-described editing support method. This article manufacturing method can further include a step of bringing a mold into contact with the imprint material on the substrate, a step of curing the imprint material, and separating the mold from the cured imprint material. This article manufacturing method can further include a step of processing the substrate including the cured imprint material.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 14A:
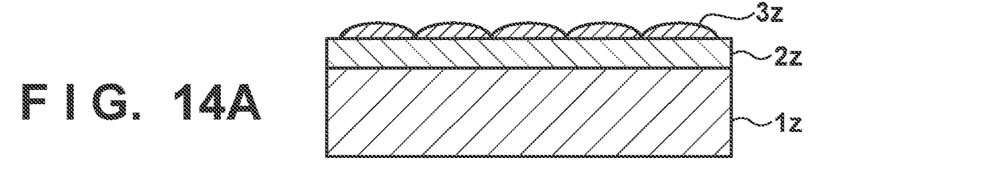
FIGS. 14A to 14F are views illustrating an article manufacturing method.

An article manufacturing method in which an imprint apparatus forms a pattern on a substrate, processes the substrate on which the pattern is formed, and manufactures an article from the processed substrate will be described next. As shown FIG. 14A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 14B:
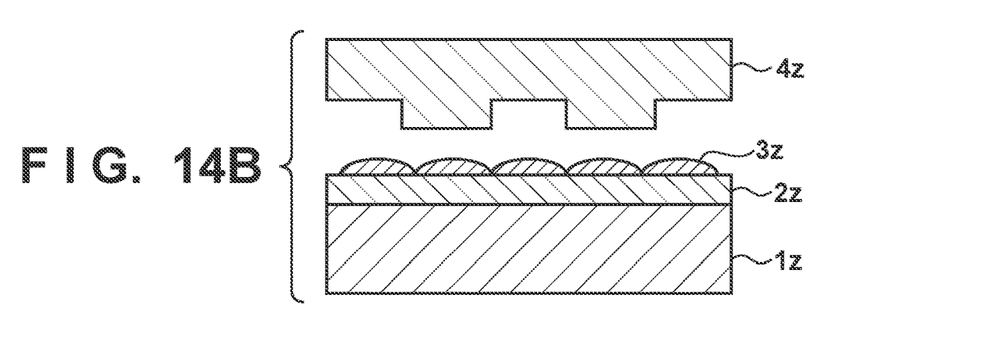
Figure 14C:
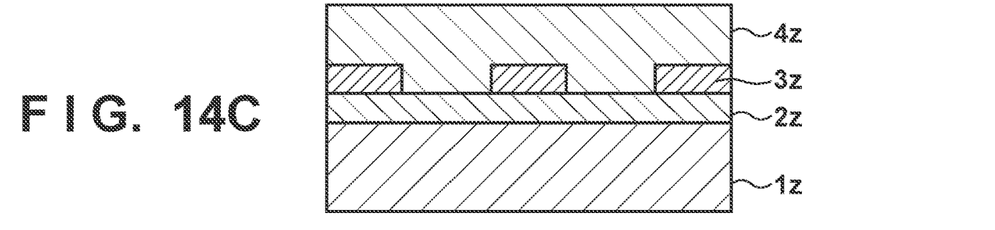

As shown in FIG. 14B, a side of a mold 4z for imprint with a concave-convex pattern is directed toward and made to face the imprint material 3z on the substrate. As shown FIG. 14C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

Figure 14D:
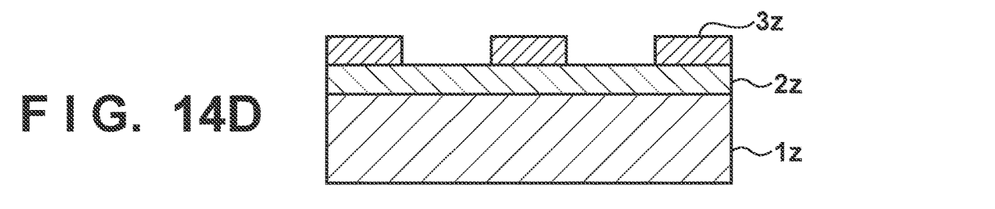

As shown in FIG. 14D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

Figure 14E:
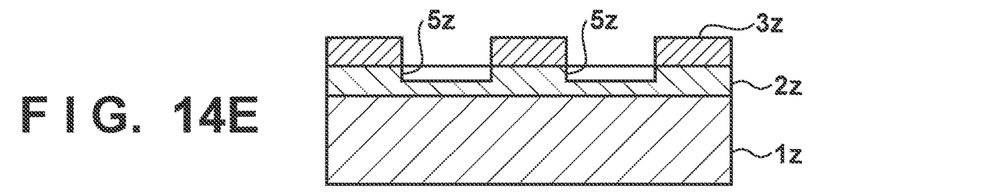
Figure 14F:
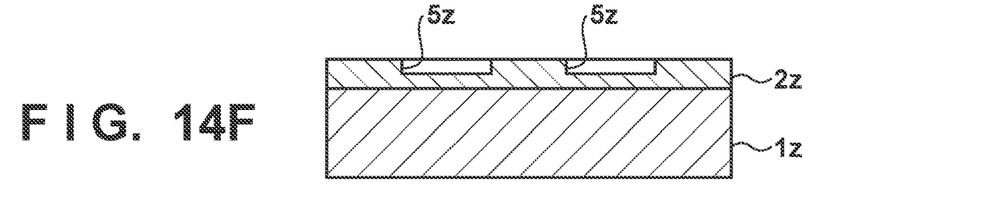

As shown in FIG. 14E, when etching is performed using the pattern of the cured product as an etching resistant mask, a portion of the surface of the processed material 2z where the cured product does not exist or remains thin is removed to form a groove 5z. As shown in FIG. 14F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-009446, filed Jan. 23, 2020, which is hereby incorporated by reference herein in its entirety.

What is claimed is:

1. A computer-implemented method of controlling a dispenser of an imprint apparatus to dispense an imprint material on a shot region of a substrate, the method comprising:
   editing, in accordance with an input from a user, a drop pattern for an arrangement of a plurality of droplets of the imprint material to be dispensed by the dispenser onto the shot region of the substrate;
   detecting, during the editing, positions of droplets within the drop pattern that do not conform to a rule that:
      defines that a droplet of the imprint material must be arranged at a position inside a boundary line of the shot region and spaced apart from the boundary line by at least a predetermined distance;
   displaying, on a display, during the editing, the positions that do not conform to the rule and positions that conform to the rule concurrently, together with shot region information indicating the shot region, with the positions that do not conform to the rule being made visibly distinguishable from the positions that conform to the rule in at least one of color, highlight, or flicker; and
   dispensing the imprint material on the substrate based on the drop pattern in the positions that conform to the rule.

2. The method according to claim 1, further comprising displaying, on the display, drop arrangement information indicating the arrangement of the imprint material with respect to the shot region together with the positions that do not conform to the rule and the positions that conform to the rule and the shot region information.

3. The method according to claim 2, further comprising displaying information corresponding to a volume of the droplet of the imprint material.

4. The method according to claim 2, wherein the displaying of the positions that do not conform to the rule and the positions that conform to the rule includes enlarging and displaying, on the display, an image of the droplets at the positions that do not conform to the rule.

5. The method according to claim 4, wherein the displaying of the positions that do not conform to the rule and the positions that conform to the rule includes emphasizing displaying of the positions that do not conform to the rule.

6. The method according to claim 1, wherein:
   the substrate includes a plurality of shot regions,
   the detecting detects, with respect to each of the plurality of shot regions, whether positions of the droplets of the drop pattern conform to the rule, and
   the displaying displays, on the display, the positions that do not conform to the rule and the positions that conform to the rule for each of the plurality of shot regions.

7. The method according to claim 6, further comprising displaying, on the display, shot layout information indicating an arrangement of the plurality of shot regions together with the droplets of the positions that do not conform to the rule and the positions that conform to the rule and the shot region information.

8. The method according to claim 1, wherein the number of droplets in the shot region is at least two hundred thousand droplets.

9. An article manufacturing method comprising:
   arranging an imprint material on a substrate based on the drop pattern in the positions that conform to the rule according to the method defined in claim 1;
   bringing a mold into contact with the imprint material on the substrate;
   curing the imprint material;
   separating the mold from the cured imprint material; and
   processing the substrate including the cured imprint material,
   wherein an article is obtained from the substrate.

10. A non-transitory computer readable medium storing a program executable by a computer to perform the method defined in claim 1.

11. An information processing apparatus for controlling a dispenser of an imprint apparatus to dispense an imprint material on a shot region of a substrate, the information processing apparatus comprising:
   a display; and
   a controller including a processor configured to:
      edit, in accordance with an input from a user, a drop pattern for controlling an arrangement of a plurality of droplets of the imprint material to be dispensed by the dispenser onto the shot region of the substrate;

detect, while the drop pattern is being edited, positions of droplets within the drop pattern that do not conform to a rule that:
- defines that a droplet of the imprint material must be arranged at a position inside a boundary line of the shot region and spaced apart from the boundary line by at least a predetermined distance;

control, while the drop pattern is being edited, the display to display the positions that do not conform to the rule and positions that conform to the rule concurrently, together with shot region information indicating the shot region, with the positions that do not conform to the rule being made visibly distinguishable from the positions that conform to the rule in at least one of color, highlight, or flicker; and control the dispenser to dispense the imprint material on the substrate based on the drop pattern in the positions that conform to the rule.

12. The apparatus according to claim 11, further comprising:
a user interface,
wherein the controller is further configured to edit the drop pattern in accordance with an operation on the user interface by a user.

* * * * *